United States Patent [19]
Li

[11] Patent Number: 6,044,032
[45] Date of Patent: Mar. 28, 2000

[54] ADDRESSING SCHEME FOR A DOUBLE DATA RATE SDRAM

[75] Inventor: Wen Li, Boise, Id.

[73] Assignee: Micron Technology, Inc., Boise, Id.

[21] Appl. No.: 09/204,073

[22] Filed: Dec. 3, 1998

[51] Int. Cl.$^7$ ................................................. G11C 8/00
[52] U.S. Cl. ............... 365/230.03; 365/236; 365/230.03; 365/230.06
[58] Field of Search ............................... 365/233, 230.03, 365/230.06, 236

[56] References Cited

U.S. PATENT DOCUMENTS

| | | | |
|---|---|---|---|
| 5,592,434 | 1/1997 | Iwamoto et al. | 365/233 |
| 5,673,233 | 9/1997 | Wright et al. | 365/233 |
| 5,703,830 | 12/1997 | Yasuhiro | 365/233 |
| 5,748,551 | 5/1998 | Ryan et al. | 365/230.03 |
| 5,757,703 | 5/1998 | Merritt et al. | 365/233 |
| 5,892,730 | 4/1999 | Sato et al. | 365/233 |
| 5,920,511 | 7/1999 | Lee et al. | 365/233 |
| 5,923,613 | 7/1999 | Tien et al. | 365/233 |
| 5,973,991 | 10/1999 | Tsuchida et al. | 365/233 |

*Primary Examiner*—Trong Phan
*Attorney, Agent, or Firm*—Dickstein Shapiro Morin & Oshinsky LLP

[57] ABSTRACT

A double data rate (DDR) synchronous dynamic random access memory (SDRAM) device with at least one memory bank is disclosed. Each memory bank is divided into two independent and simultaneously accessible memory planes. A unique addressing circuit controlled by an internal clock generates addresses for each plane from one external address. The generated addresses allow both planes to be accessed simultaneously. Thus, two sets of data from two independent planes of memory are simultaneously accessed in one system clock cycle.

91 Claims, 6 Drawing Sheets

ADDRESSING SCHEME FOR A DOUBLE DATA RATE SDRAM

BACKGROUND OF THE INVENTION

1. Field of the Invention

The present invention relates to the field of semiconductor memory devices and, more particularly to an addressing scheme for double data rate (DDR) synchronous dynamic random access memory (SDRAM) devices.

2. Description of the Related Art

There is a demand for faster, higher capacity, random access memory (RAM) devices. RAM devices, such as dynamic random access memory (DRAM) are typically used as the main memory in computer systems. Although the operating speed of the DRAM has improved over the years, the speed has not reached that of the processors used to access the DRAM. In a computer system, for example, the slow access and cycle times of the DRAM lead to system bottlenecks. These bottlenecks slow down the throughput of the system despite the very fast operating speed of the system's processor.

A newer type of memory known as a synchronous dynamic random access memory (SDRAM) has been developed to provide faster operation in a synchronous manner. SDRAMs are designed to operate synchronously with the system clock. That is, input and output data of the SDRAM are synchronized to an active edge of the system clock which is driving the processor accessing the SDRAM.

Some SDRAMs are capable of synchronously providing burst data at a high-speed data rate by automatically generating a column addresses for a memory array of storage cells organized as rows and columns. In addition, some SDRAMs utilize two or more banks of memory arrays which permits interleaving data betveen the banks to reduce access times and increase the speed of the memory.

Although SDRAMs have overcome disadvantages of the other memory devices, such as DRAMs, there is still a need for faster memory devices. Double data rate (DDR) SDRAMs are being developed to provide twice the operating speed of the conventional SDRAM. These devices allow data transfers on both the rising and falling edges of the system clock and thus, provide twice as much data as the conventional SDRAM. DDR SDRAMs are also capable of providing burst data at a high-speed data rate.

Although DDR SDRAMs provide speedier operation times, they typically involve complicated addressing schemes and circuitry in order to synchronize the data access and transfers occurring on both the rising and falling edges of the system clock. Accordingly, there is a desire and need for a simplified addressing scheme of a DDR SDRAM.

SUMMARY OF THE INVENTION

The present invention provides a simplified addressing scheme for a double data rate (DDR) synchronous dynamic random access memory (SDRAM) device.

The above and other features and advantages of the invention are achieved by providing a DDR SDRAM with at least one memory bank. Each memory bank is divided into two independent and simultaneously accessible memory planes. A unique addressing circuit controlled by an internal clock generates addresses for each plane from one external address. The generated addresses allow both planes to be accessed simultaneously and without waiting for the falling edge of the system clock. Thus, two sets of data from two independent planes of memory are simultaneously accessed in one system clock cycle.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENTS

Figure 1:
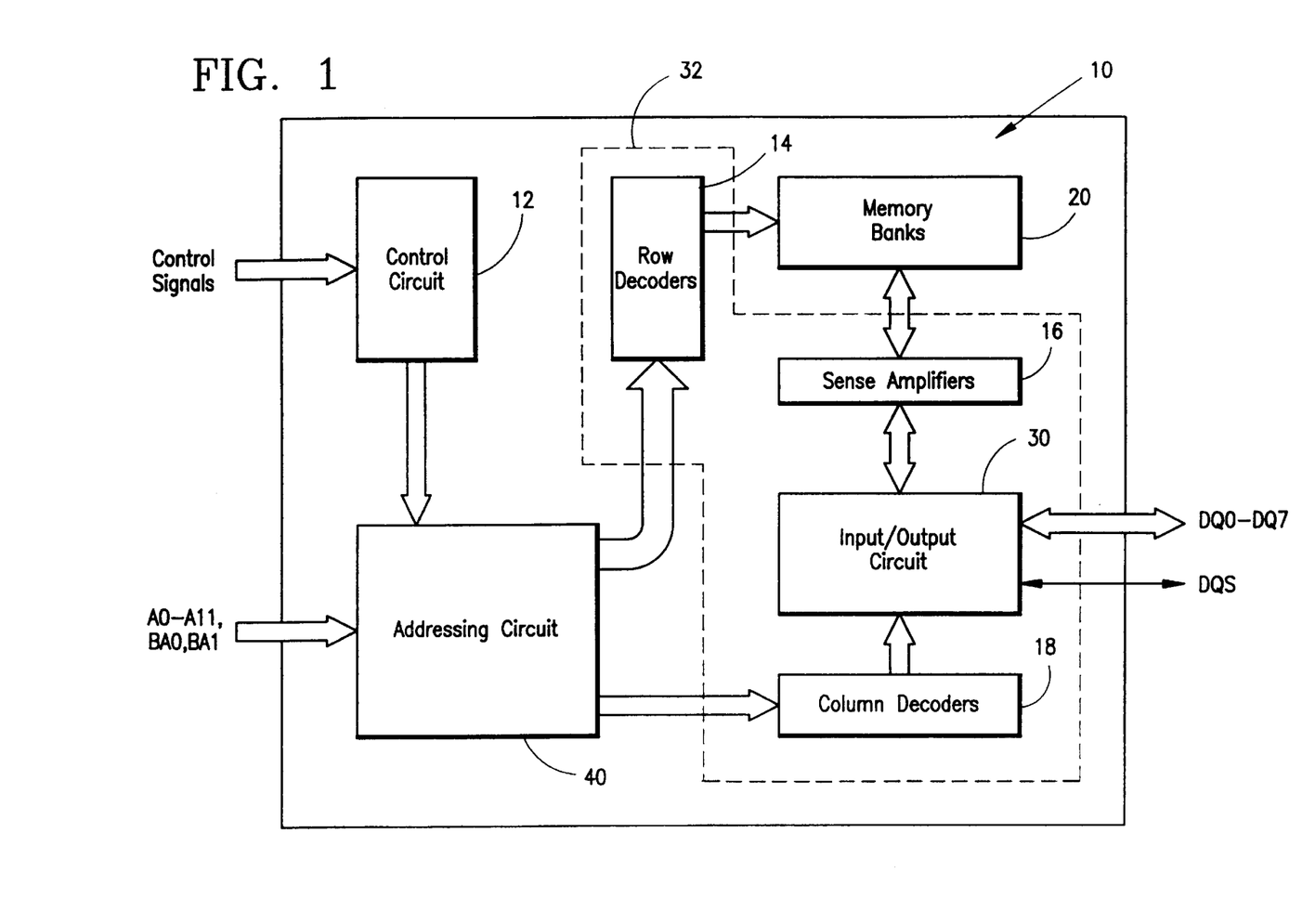
FIG. 1 illustrates a synchronous dynamic random access memory (SDRAM) constructed in accordance with a preferred embodiment of the present invention.

FIG. 1 illustrates a SDRAM 10 constructed in accordance with a preferred embodiment of the present invention. The SDRAM 10 includes a control circuit 12, addressing circuit 40, input/output circuit 30, four memory banks 20, four sense amplifier circuits 16, four column decoders 18 and four row decoders 14. The row and column decoders 14, 18, sense amplifiers 16 and input/output logic circuit 30 comprise an array interface circuit 32 providing an interface betveen the banks 20, addressing circuit 40 and an external device (through input/output pins DQ0–DQ7). It must be noted that the illustrated configuration of the array interface circuit 32 is but one of many possible configurations and the invention is not to be so limited to the specific circuit illustrated in FIG. 1. Although a preferred embodiment uses four memory banks 20, it must be noted that the present invention can utilize, for example, one, two, four, eight or more memory banks 20. It must also be noted that for convenience purpose only, FIG. 1 illustrates one memory bank 20, sense amplifier circuit 16, column decoder 18 and row decoder 14.

Preferably, the SDRAM 10 contains eight input/output pins DQ0–DQ7. This is referred to as a "x8" device since eight bits are input or output at one time. It must be noted that the SDRAM 10 can also be configured to have four input/output pins (i.e., a "x4" device), sixteen input/output pins (i.e., a "x16" device) or more.

Each of the memory banks 20 contain memory cells arranged in rows and columns and are connected to a respective row decoder 14 and sense amplifier circuit 16. Preferably, the size of the memory banks 20 are at least 16M each (that is, 16,777,216 individual memory cells or "bits"), although any size bank 20 can be used.

Figure 2:
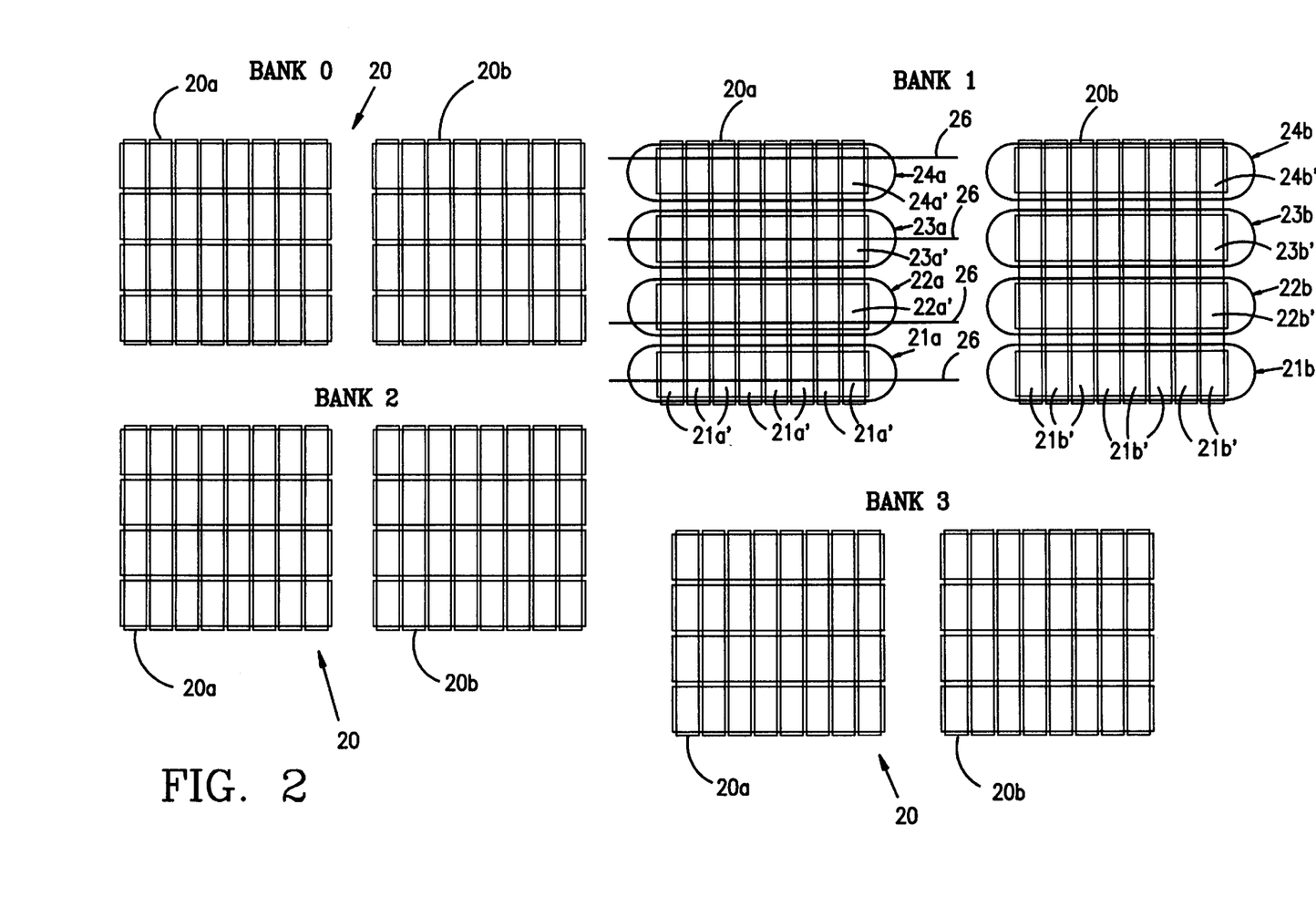
FIG. 2 illustrates an exemplary configuration of memory banks utilized in the SDRAM of FIG. 1.

As illustrated in FIG. 2, each of the four memory banks 20 (also individually labeled as BANK 0, 1, 2 and 3) are divided into two planes 20a, 20b. Each plane 20a is further broken down into four column sections, i.e., sections 21a, 22a, 23a, 24a. Likewise, each plane 20b is further broken down into four column sections, i.e., sections 21b, 22b, 23b, 24b.

As is known in the art, each column section 21a, 22a, 23a, 24a for plane 20a respectively maps to two input/output pins DQ0–DQ7 when the SDRAM 10 is configured as "x8." As is also known, each column section 21a, 22a, 23a, 24a for plane 20a respectively maps to one input/output pin DQ0–DQ3 when the SDRAM 10 is configured as "x4." Likewise, each column section 21b, 22b, 23b, 24b for plane 20b respectively maps to two input/output pins DQ0–DQ7 when the SDRAM 10 is configured as "x8" while each column section 21b, 22b, 23b, 24b for plane 20b respectively maps to one input/output pin DQ0–DQ3 when the SDRAM 10 is configured as "x4."

FIG. 2 also illustrates how the column section 21a for plane 20a can be organized into eight subsections, i.e., eight subsections 21a'. It must be noted that column sections 22a, 23a, 24a for plane 20a can also be respectively organized into eight subsections, i.e., eight subsections 22a, eight subsections 23a' and eight subsections 24a'. Likewise, FIG. 2 illustrates how the column section 21b for plane 20b can be organized into eight subsections, i.e., eight subsections 21b'. It must be noted that column sections 22b, 23b, 24b for plane 20b can also be respectively organized into eight subsections each, i.e., eight subsections, 22b', eight subsections 23b' and eight subsections 24b'.

When one column select signal 26 is received in one plane, e.g., plane 20a of a memory bank 20, one column from each of the column sections 21a, 22a, 23a, 24a is activated (collectively referred to herein as a column for a plane 20a). That is, an individual column is activated in section 21a, an individual column is activated in section 22a, an individual column is activated in section 23a and an individual column is activated in section 24a. If column section 21a, for example, were split into eight subsections, e.g. subsections 21a', one column from one of the respective subsections would be activated. In addition, four bits of memory (if the SDRAM 10 is "x8") are activated within each section 21a, 22a, 23a, 24a. Therefore, with one column select signal 26, sixteen bits of information for the plane 20a are accessible. The input/output circuit 30 determines which bits of the activated plane 20a are mapped to the input/output pins DQ0–DQ7. A column select signal 26 received in plane 20b, will activate one column in each of the column sections 21b, 22b, 23b, 22b in a similar manner.

As will be described below with reference to FIGS. 3 and 4, each plane 20a, 20b of a memory bank 20 operates independently of each other and thus, both planes 20a, 20b may be accessed at the same time. This doubles the amount of data being accessed in a memory bank 20. In a read operation, for example, one set of data is simultaneously accessed from each plane 20a, 20b of a bank 20, the input/output circuitry 30 pipelines the two sets of data, outputs the data from one plane over the input/output pins DQ0–DQ7 and then outputs the data from the other plane over the input/output pins DQ0–DQ7. In a write operation, for example, the input/output circuitry 30 will pipeline two sets of input data received over the input/output pins DQ0–DQ7 and then simultaneously send this information to the two planes 20a, 20b of a bank 20.

Referring again to FIG. 1, each of the memory banks 20 are also connected to the input/output circuit 30 which is connected to the four column decoders 18. The input/output circuit 30 includes conventional read circuitry (not shown) for outputting data from the memory banks 20 to input/output pins DQ0–DQ7. The input/output circuit 30 also includes conventional write circuitry (not shown) for inputting data received on the input/output pins DQ0–DQ7 into the memory banks 20. Accordingly, the input/output circuit 30 provides a path for data being transmitted between the memory banks 20 and an external device (connected to the input/output pins DQ0–DQ7). The input/output circuit 30 is also connected to a data strobe DQS. The data strobe DQS is a bi-directional signal that is received when input data arrives (data write operation) and is transmitted along with output data (data read operation).

The control circuit 12 is connected to the addressing circuit 40 and receives control signals as an input. The control circuit 12 includes conventional command decoder circuitry (not shown) used to interpret the control signals and drive the remaining circuitry of the SDRAM 10. As is known in the art, the control signals include a system clock CLK, clock enable CKE, column address strobe (CAS#), row address strobe (RAS#), write enable (WE#), and chip select (CS#) signals (the # designation indicates that the signal is active low). The CAS#, RAS#, WE#, and CS# signals define the commands received by the control logic 12 while the CLK and CKE signals are used to synchronize the operation of the SDRAM 10 to the external system clock.

Distinct combinations of the control signals constitute distinct commands. For example, the combination of RAS# low, CAS# high and WE# low represents a PRECHARGE command. A PRECHARGE command is used to deactivate an open (or activated) row of memory cells within a memory bank 20 or the open rows in all of the banks 20 within the SDRAM 10. Examples of other well known commands include, but are not limited to, the ACTIVE, READ, WRITE, BURST TERMINATE, AUTO REFRESH, LOAD MODE REGISTER, COMMAND INHIBIT and NOP commands.

The ACTIVE command is used to open up (or activate) a row of memory cells in a particular bank 20 for a subsequent access. The row remains active until a PRECHARGE command deactivates it. The READ command is used to initiate a burst read access for an active row. The WRITE command is used to initiate a burst write access for an active row. The READ and WRITE commands will also be accompanied with the column and bank addresses to complete the addressing for the command. The AUTO REFRESH command is used to refresh the contents of the memory arrays 20. The BURST TERMINATE command is used to truncate a read burst. The LOAD MODE REGISTER allows a mode register of the control circuit 12 to be loaded. The mode register contains information such as burst length and type. The COMMAND INHIBIT command is used to prevent new commands from being executed by the SDRAM 10. The NOP (no-operation) command is used to prevent unwanted commands from being registered while the SDRAM 10 is in an idle or wait state. Operations already in progress, however, are not affected by, the COMMAND INHIBIT and NOP commands and are allowed to complete.

The control circuit 12 is connected to and passes control signals to the addressing circuit 40. The addressing circuit 40 also receives address signals A0–A11 and bank address signal BA0, BA1 as inputs. The addressing circuit 40 provides row and bank addresses to the row decoders 14. The addressing circuit 40 also provides column and bank addresses to the column decoders 18. The row decoders 14 activate the addressed row of the appropriate bank of memory 20. The column decoders 18 activate the addressed column of the appropriate bank of memory 20 (through the input/output circuit 30 and the sense amplifiers 16). In a preferred embodiment, only one bank 20 will be addressed and thus, accessed at a time.

With reference to FIGS. 1 and 2, in a preferred embodiment, the address and bank address signals A0–A11, BA0, BA1 provide a row address (for the bank 20 identified by BA0, BA1) when the SDRAM 10 receives an ACTIVE command. The address and bank address signals A0–A9 (for "x4" or A0–A8 for "x8"), BA0, BA1 provide a column address when the SDRAM 10 receives a command such as, for example, a READ or WRITE. As will be discussed below with reference to FIGS. 3 and 4, the addressing circuit 40 will generate a second column address for the same addressed bank 20 from the received column address. The second column address will be for a plane 20a, 20b that is different than the plane 20a, 20b being addressed by the received column address. The two column addresses are used by the column decoders 18 to generate respective column select signals 26 (one for plane 20a and one for plane 20b) which in turn activates a column of memory in each column section 21a, 22a, 23a, 24a (plane 20a) and 21b, 22b, 23b, 24b (plane 20b) in the addressed bank 20. As stated above, only one of the four banks 20 will be accessed at a time.

Figure 3:
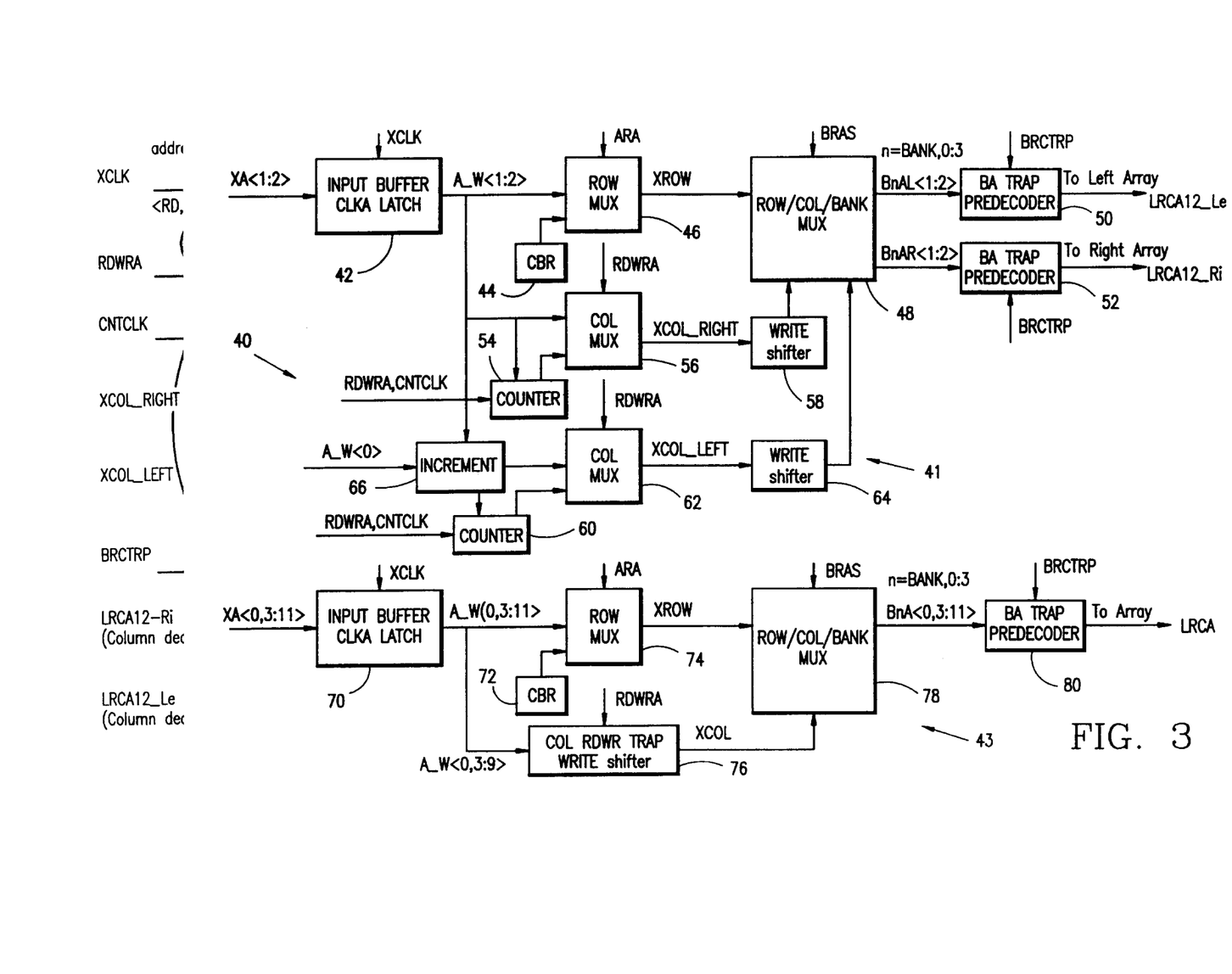
FIG. 3 illustrates an exemplary addressing circuit utilized in the SDRAM of FIG. 1.

FIG. 3 illustrates an exemplary addressing circuit 40 constructed in accordance with the present invention. The addressing circuit 40 contains a first addressing portion 41 and a second addressing portion 43. The first addressing portion 41 includes an input buffer latch 42, CAS before RAS (CBR) counter 44, row multiplexer 46, two column multiplexers 56, 62, two write shifters 58, 64, an incrementor 66, row/column/bank multiplexer 48 and two predecoders 50, 52. The second addressing portion 43 includes an input buffer latch 70, CBR counter 72, row multiplexer 74, column write shifter 76, row/column/bank multiplexer 78 and predecoder 80. As will be described below, the output of the addressing circuit 40 includes row and column addresses to be used to simultaneously access the memory cells of two planes 20a, 20b (FIG. 2) within a single bank of memory 20.

Figure 6:
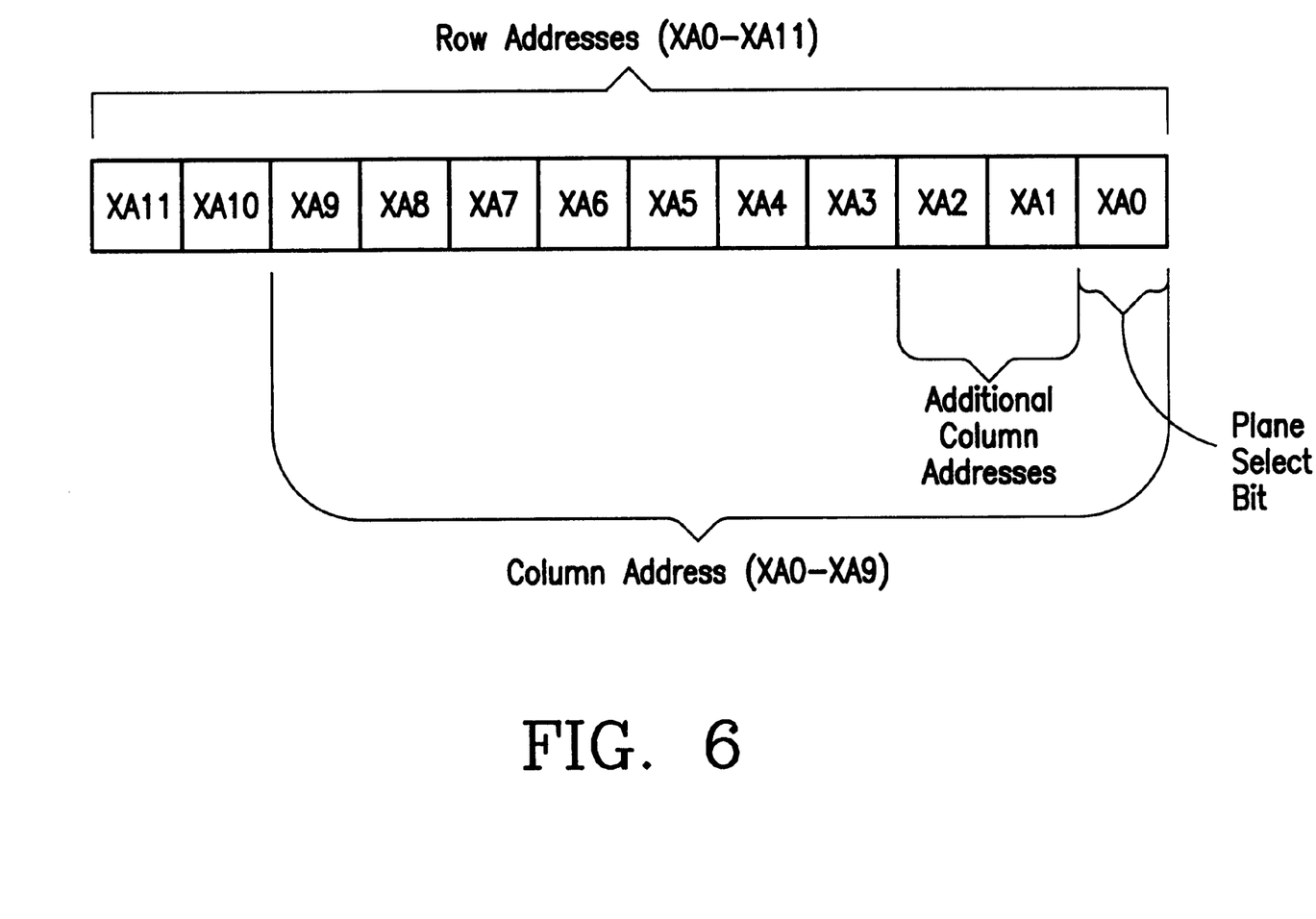
FIG. 6 illustrates addressing bits used in the addressing scheme of the SDRAM constructed in accordance with the present invention.

The addressing circuit 40 of the present invention will receive one external row and bank address with the ACTIVE command (described above with reference to FIG. 1). The addressing circuit 40 will also receive one external column and bank address with either the READ or WRITE command and generate a second column addresses (so there will be a column address for each plane within a memory bank) without waiting for the falling edge of the system clock. FIG. 6 illustrates external address bits XA0–XA11. A row address will consist of address bits XA0–XA11 while a column address will consist of bits XA0–XA9 (for "x4" or XA0–XA8 for "x8").

The addressing circuit 40 will utilize address bit XA0 of the received column address to determine which plane the received column address is for. That is, the column address accompanying the READ or WRITE command corresponds to either plane 20a or 20b of the addressed bank 20 (FIG. 2). When the received column address bit XA0 is set to 0, for example, the addressing circuit 40 will use the received column address to access plane 20a and the generated column address to access the plane 20b. Likewise, when column address bit XA0 is set to 1, for example, the addressing circuit 40 will use the received column address to access plane 20b and the generated column address to access the plane 20a. It must be noted that the addressing circuit 40 could also be configured to use the received column address to access plane 20b when column address bit XA0 is set to 0 and the generated column address to access the plane 20a.

As will be described below, for a burst READ or a burst WRITE command, both the received column address and the generated second column address will each be used to predict additional addresses to complete the burst access. The prediction occurs by incrementing address bits XA1 and XA2 and thus, creating a new address bits XA0–XA9, by a burst counter. Additional addresses predicted from the received column address will correspond to the plane of the received address. Additional addresses predicted from the generated second column address will correspond to the plane of the second column address.

For convenience purposes only, the following description will refer to the first plane 20a as the LEFT plane and the second plane 20b as the RIGHT plane. Any signals or addresses that are to be used by either the LEFT or RIGHT plane, but not both, will include the label "LEFT" or "RIGHT."

The input buffer latch 42 of the first addressing portion 41 receives external address bits XA1 and XA2. These bits are input into the input buffer latch 42 which is clocked by the system clock XCLK. The output A_W of the latch 42 is latched address bits XA1 and XA2 and is used as an input by the row multiplexer 46, the first counter 54, the first column multiplexer 56 and the incrementor 66. The row multiplexer 46 has an input connected to the output of the CBR 44. As is known in the art, the CBR 44 provides a refresh signal at the appropriate time to initiate a refresh of the SDRAM 10. The row multiplexer 46 is controlled by a signal ARA allowing the output XROW to be either A_W or the refresh signal of the CBR 44. The output XROW is used as an input by the row/column/bank multiplexer 48.

The first counter 54 is driven by the READ or WRITE command signal RDWRA and an internal control clock signal CNTCLK. The first counter 54 generates a new column address from the input A_W received from the latch 42. The counter 54 generates a new address for the next access in a burst READ or WRITE command for the RIGHT plane only. The first counter output is used as an input by the first column multiplexer 56. The first column multiplexer 56 is controlled by the RDWRA signal allowing the output XCOL_RIGHT to be either the input A_W or the new column address generated by the counter 54. In operation, XCOL_RIGHT will be the latch output A_W for the first memory, access of a burst READ or WRITE command, while XCOL_RIGHT will be the output of the counter 54 for the subsequent accesses within the burst. It must be noted that the output XCOL_RIGHT is only a portion of a column address to be used to access the RIGHT plane of a memory bank. The remainder of the address is provided by the second addressing portion 43 (described below). The output XCOL_RIGHT is input into the first write shifter 58 which is used to synchronize XCOL_RIGHT to the internal write enable during a write. XCOL_RIGHT by-passes the shifter 58 during read operations. The output of the first write shifter 58 is connected to and used as an input by the row/column/bank multiplexer 48.

The incrementor 66 receives and increments the latch output A_W. The incrementor 66 generates an initial column address for the LEFT plane. The incrementor output is used as an input by the second column multiplexer 62. The second counter 60 is driven by the READ or WRITE command signal RDWRA and an internal control clock signal CNTCLK. The second counter 60 generates a new column address from the increment A_W received from the incrementor 66. The second counter 60 generates a new address for the next access in a burst READ or WRITE command for the LEFT plane only. The second counter output is used as an input by the second column multiplexer 62. The second column multiplexer 62 is controlled by the RDWRA signal allowing the output XCOL_LEFT to be either the incremented A_W or the new column address generated by the second counter 60. In operation, XCOL_

LEFT will be the incremented A_W for the first memory access of a burst READ or WRITE command, while XCOL_LEFT will be the output of the second counter 60 for the subsequent accesses within the burst. It must be noted that the output XCOL_LEFT is only a portion of a column address to be used to access the LEFT plane of a memory bank. The remainder of the address is provided by the second addressing portion 43 (described below). The output XCOL_LEFT is input into the second write shifter 64 which is used to synchronize XCOL_LEFT to the internal write enable during a write. XCOL_LEFT by-passes the shifter 64 during read operations. The output of the second write shifter 64 is connected to and used as an input by the row/column/bank multiplexer 48.

The row/column/bank multiplexer 48 is controlled by a signal BRAS. The signal BRAS allows one of the inputs XROW, XCOL_LEFT, XCOL_RIGHT to be output as one of the multiplexer outputs BnAL<1:2>, BnAR<1:2>. The signal BRAS includes the bank address bits BA0, BA1. The output BnAL<1:2> of the multiplexer 48 is a portion (i.e., bits 1 and 2) of either a row or column address destined for the LEFT plane while the output BnAR<1:2> is a portion (i.e., bits 1 and 2) of either a row or column address destined for the RIGHT plane (where the "n" indicates which bank of memory is being addressed). Accordingly, the first addressing portion 41 has created a portion of two column addresses and a row address.

These outputs BnAL<1:2>, BnAR<1:2> of the multiplexer 48 are sent to respective predecoders 50, 52. The predecoders 50, 52 are controlled by a trap signal BRCTRP. The predecoders 50, 52 latch the outputs BnAL<1:2>, BnAR<1:2> and synchronize the outputs to the external clock XCLK. The outputs LRCA12_LE, LRCA12_RI of the two predecoders 50, 52 are combined with the output LRCA of the second addressing portion 43 to form a complete row and column address (as illustrated in FIG. 6) by additional circuitry (not shown). These row and column addresses are applied to the correct row and column decoders to activate the addressed rows and columns.

A description of the second addressing portion 43 now follows. The input buffer latch 70 of the second addressing portion 43 receives external address bits XA0 and XA3–XA11. These bits are input into the input buffer latch 70 which is clocked by the system clock XCLK. The output A_W of the latch 70 is latched address bits XA0 and XA3–XA11 and is used as an input by the row multiplexer 74. XA0 and XA3–XA9 are used as inputs to the column write shifter 76. The row multiplexer 74 has an input connected to the output of the CBR 72. The row multiplexer 74 is controlled by a signal ARA allowing the output XROW to be either A_W or the refresh signal of the CBR 72. The output XROW is used as an input by the row/column/bank multiplexer 78.

The column write shifter 76 is driven by the READ or WRITE command signal RDWRA. The shifter 76 shifts the latch output A_W and outputs a shifted address XCOL. Unlike the first addressing portion 41, the column address does not need to be incremented or generated, it is merely shifted for synchronization purposes. It must be noted that the output XCOL is only a portion of a column address to be used to access either the RIGHT or LEFT plane of a memory bank. The remainder of the address is provided by the first addressing portion 41 (described above). The output XCOL is connected to and used as an input by the row/column/bank multiplexer 78.

The row/column/bank multiplexer 78 is controlled by a signal BRAS. The signal BRAS is a code allowing one of the inputs XROW or XCOL to be output as the multiplexer output BnA<0,3:11>. The signal BRAS includes the bank address bits BA0, BA1. The output BnA<0,3:11> of the multiplexer 78 is a portion (i.e., bits 0 and 3–11) of a row or column address destined for the both planes (where the "n" indicates which bank of memory is being addressed). Accordingly, the second addressing portion 43 has created a portion of a single column address and a row address.

This output BnA<0,3:11> is sent to a predecoders 80. The predecoder 80 is controlled by a trap signal BRCTRP. The predecoder 80 latches the output BnA<0,3:11> and synchronizes it to the external clock XCLK. The output LRCA of the predecoder 80 is combined with the outputs LRCA12_LE, LRCA12_RI of the first addressing portion 41 to form a complete row and column address (as illustrated in FIG. 6) by additional circuitry (not shown). These row and column addresses are applied to the correct row and column decoders to activate the addressed rows and columns.

Figure 4:
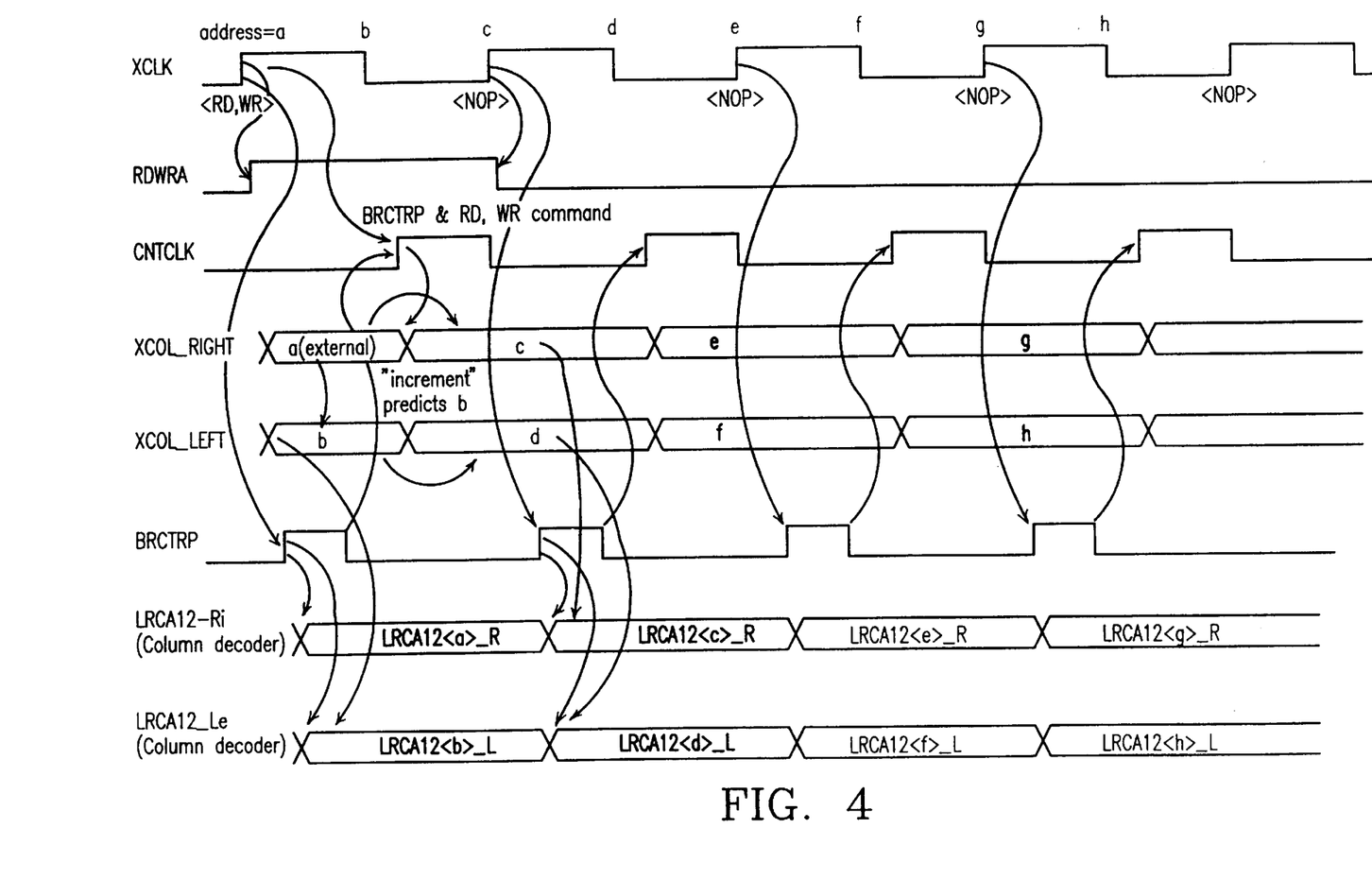
FIG. 4 is a timing diagram of the addressing scheme of the SDRAM of FIG. 1.

As illustrated in FIG. 4, the addressing circuit 40 uses an internal clock signal CNTCLK to generate the address portions LRCA12_LE and LRCA12_RI without waiting for the falling edge of the external system clock XCLK to occur. FIG. 4 illustrates a burst access of 8 memory locations (indicated by addresses a through h). As shown, when a READ or WRITE command RDWRA is received, XCOL_RIGHT for address a is taken from the received external address bits XA1, XA2 while simultaneously, XCOL_LEFT (address b) is internally generated. The XCOL_RIGHT and XCOL_LEFT for addresses c though h are generated on successive internal clock cycles CNTCLK. Also shown, is how the outputs LRCA12_LE, LRCA12_RI of the predecoders are latched (via BRCTRP) within the rising edge of the system clock XCLK also. This allows the SDRAM 10 constructed in accordance with the present invention to operate more like a single data rate (SDR) SDRAM which aligns its data to the rising edge of the system clock only.

Figure 5:
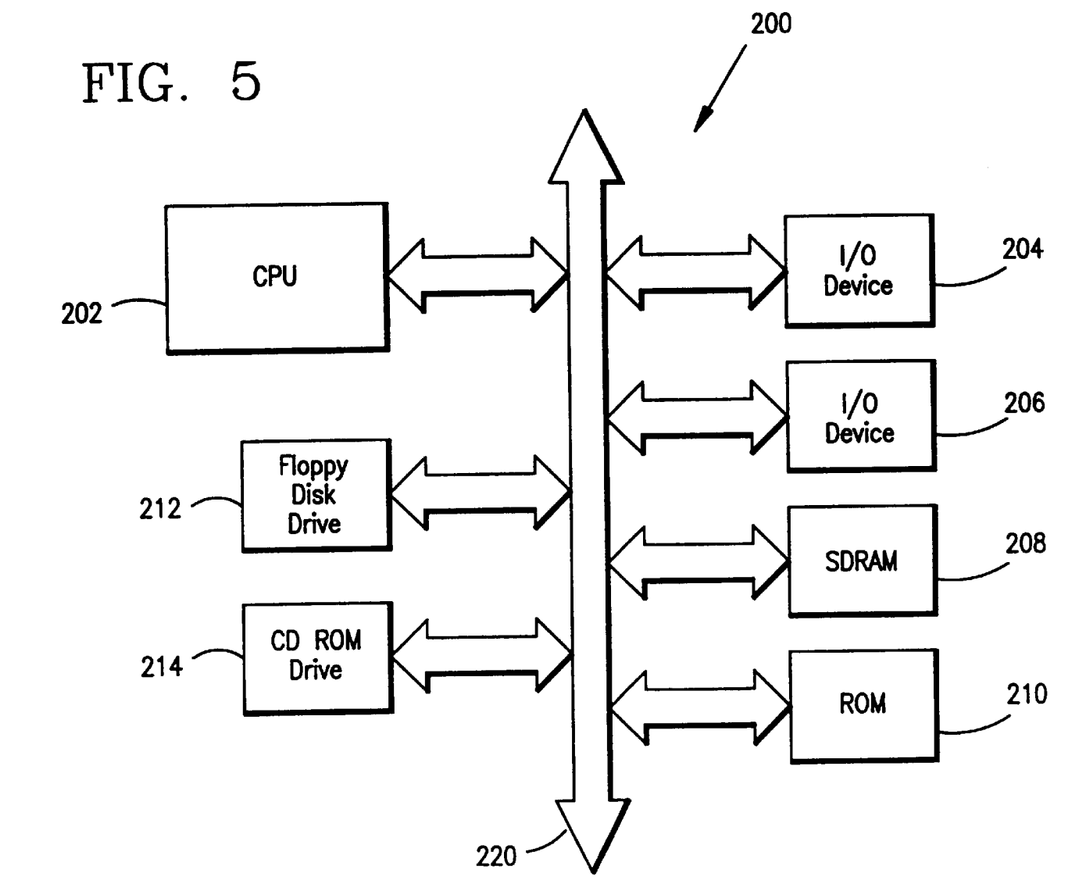
FIG. 5 illustrates a computer system utilizing a SDRAM constructed in accordance with the present invention.

FIG. 5 illustrates a computer system 200 including a SDRAM 208 constructed in accordance with the present invention. The SDRAM 208 operates as described above with reference to FIGS. 1–4. The computer system 200 also includes a central processing unit (CPU) 202 that communicates to the SDRAM 208 and an I/O device 204 over a bus 220. A second I/O device 206 is illustrated, but is not necessary to practice the invention. The computer system 200 also includes read only memory (ROM) 210 and may include peripheral devices such as a floppy disk drive 212 and a compact disk (CD) drive 214 that also communicate with the CPU 202 over the bus 220 as is well known in the art.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A memory circuit comprising:
   at least one memory bank, each said memory bank being divided into at least two planes, each of said planes having memory cells organized into rows and columns;

an interface circuit, said interface circuit being coupled to said at least one memory bank for accessing selected memory cells of said at least one memory bank; and an addressing circuit coupled to said interface circuit, said addressing circuit receiving a first address of a location within at least a first plane of one memory bank and generating a second address of a location within at least a second plane of said one memory bank, said addressing circuit receiving said first address and generating said second address associated with a first portion of a first clock signal, said addressing circuit applying said first and second addresses to said interface circuit to access said memory cells of said one memory bank.

2. The memory circuit of claim 1 wherein a number of planes for each of said at least one memory bank is two.

3. The memory circuit of claim 1 wherein said addressing circuit generates an additional address for said at least first and second planes associated with said first portion of said first clock signal.

4. The memory circuit of claim 3 wherein said first clock signal is an external clock signal.

5. The memory circuit of claim 3 wherein said first portion of said first clock signal is a first edge of said first clock signal.

6. The memory circuit of claim 3 wherein said first portion of said first clock signal is a rising edge of said first clock signal.

7. The memory circuit of claim 1 wherein said addressing circuit generates a plurality of additional addresses for said at least first and second planes of said respective bank at subsequent first portions of said first clock signal.

8. The memory circuit of claim 7 wherein said first clock signal is an external clock signal.

9. The memory circuit of claim 7 wherein said first portion of said first clock signal is a first edge of said first clock signal.

10. The memory circuit of claim 7 wherein said first portion of said first clock signal is a rising edge of said first clock signal.

11. The memory circuit of claim 1 wherein said at least one bank is a plurality of memory banks.

12. The memory circuit of claim 11 wherein a number of said memory banks is $2^n$, where n is greater than 0.

13. The memory circuit of claim 1, wherein a portion of said first address is used as an identifier for said planes of said plurality of memory banks.

14. The memory circuit of claim 1 wherein said addressing circuit comprises:

a first addressing portion providing a first portion of said first and second addresses to said interface circuit; and a second addressing portion providing a second portion of said first and second addresses to said interface circuit, wherein said first and second addressing portions are driven by a second clock signal responsive to said first portion of said first clock signal.

15. The memory circuit of claim 14 wherein said first clock signal is an external clock signal.

16. The memory circuit of claim 14 wherein said first portion of said first clock signal is a first edge of said first clock signal.

17. The memory circuit of claim 14 wherein said first portion of said first clock signal is a rising edge of said first clock signal.

18. The memory circuit of claim 14 wherein said second clock signal is an internal clock signal.

19. The memory circuit of claim 18 wherein said second clock signal is responsive to a first edge of said first clock signal.

20. The memory circuit of claim 18 wherein said second clock signal is responsive to a rising edge of said first clock signal.

21. The memory circuit of claim 14 wherein said first addressing portion comprises:

a multiplexer, said multiplexer having a plurality of inputs and an output;

a row address generating portion providing a row portion of said first and second address to a first input of said multiplexer;

a first column address generating portion providing a first column portion of said first address to a second input of said multiplexer; and a second column address generating portion providing a second column portion of said second address to a third input of said multiplexer, wherein said multiplexer output is controlled to be either said row or column portions of said first portion of said first and second addresses.

22. The memory circuit of claim 21 wherein said first column address generating portion comprises:

a counter receiving said portion of said first address and generating therefrom an additional address portion; and a second multiplexer halting said portion of said first and additional address portion as inputs, said second multiplexer being controlled to output one of said inputs to said second multiplexer as said portion of said first address associated with said first portion of said first clock signal and to output said portion of said additional address at a subsequent first portion of said first clock signal.

23. The memory circuit of claim 22 wherein said first clock signal is an external clock signal.

24. The memory circuit of claim 22 wherein said first portion of said first clock signal is a first edge of said first clock signal.

25. The memory circuit of claim 22 wherein said first portion of said first clock signal is a rising edge of said first clock signal.

26. The memory circuit of claim 21 wherein said second column address generating portion comprises:

an incrementor receiving said portion of said first address and generating therefrom said portion of said second address;

a counter receiving said portion of said second address and generating therefrom an additional address portion of said second plane; and a second multiplexer having said portion of said second and additional address portion as inputs, said second multiplexer being controlled to output one of said inputs to said second multiplexer as said portion of said second address associated with said first portion of said first clock signal and to output said portion of said additional address at a subsequent first portion of said first clock signal.

27. The memory circuit of claim 26 wherein said first clock signal is an external clock signal.

28. The memory circuit of claim 26 wherein said first portion of said first clock signal is a first edge of said first clock signal.

29. The memory circuit of claim 26 wherein said first portion of said first clock signal is a rising edge of said first clock signal.

30. The memory circuit of claim 22 wherein said second column address generating portion comprises:

an incrementor receiving said portion of said first address and generating therefrom said portion of said second address;

a counter receiving said portion of said second address and generating therefrom an additional address portion of said second plane; and a third multiplexer having said portion of said second and additional address portion as inputs, said third multiplexer being controlled to output one of said inputs to said third multiplexer as said portion of said second address associated with said first portion of said first clock signal and to output said portion of said additional address at a subsequent first portion of said first clock signal.

31. The memory circuit of claim 14 wherein said second addressing portion comprises:

a multiplexer, said multiplexer having a plurality, of inputs and an output;

a row address generating portion providing a row portion of said first and second address to a first input of said multiplexer; and a column address generating portion providing a column portion of said first and second address to a second input of said multiplexer, wherein said multiplexer output is controlled to provide either said row or column second portions of said first and second addresses.

32. The memory circuit of claim 1 wherein said circuit operates as a double data rate synchronous dynamic random access memory circuit.

33. The memory circuit of claim 1 wherein each of said memory bank comprises 16M of memory cells.

34. The memory circuit of claim 1 wherein memory cells corresponding to said first and second addresses are accessed simultaneously.

35. The memory circuit of claim 3 wherein memory cells corresponding to said first and second addresses are accessed simultaneously associated with said first portion of said first clock signal and memory cells corresponding to said additional address are accessed simultaneously associated with a subsequent first portion of said first clock signal.

36. The memory circuit of claim 7 wherein memory cells corresponding to said first and second addresses are accessed simultaneously associated with said first portion of said first clock signal and memory cells corresponding to said additional address are accessed simultaneously associated with subsequent first portions of said first clock signal.

37. The memory circuit of claim 1 wherein each plane for each of said at least one memory bank is divided into a plurality of sections.

38. The memory circuit of claim 37 wherein each of said plurality of sections is divided into a plurality of subsections.

39. A computer system comprising:

a processor; and a memory circuit coupled to said processor, said memory circuit comprising:

at least one memory bank, each said memory bank being divided into at least two planes, each of said planes having memory cells organized into rows and columns;

an interface circuit, said interface circuit being coupled to said at least one memory bank for accessing selected memory cells of said at least one memory bank; and an addressing circuit coupled to said interface circuit, said addressing circuit receiving a first address of a location within at least a first plane of one memory bank and generating a second address of a location within at least a second plane of said one memory bank, said addressing circuit receiving said first address and generating said second address associated with a first portion of a first clock signal, said addressing circuit applying said first and second addresses to said interface circuit to access said memory cells of said one memory bank.

40. The system of claim 39 wherein a number of planes for each of said at least one memory bank is two.

41. The system of claim 39 wherein said addressing circuit generates an additional address for said at least first and second planes of said respective bank associated with said first portion of said first clock signal.

42. The system of claim 41 wherein said first clock signal is an external clock signal.

43. The system of claim 41 wherein said first portion of said first clock signal is a first edge of said first clock signal.

44. The system of claim 41 wherein said first portion of said first clock signal is a rising edge of said first clock signal.

45. The system of claim 39 wherein said addressing circuit generates a plurality of additional addresses for said at least first and second planes of said respective bank at subsequent first portions of said first clock signal.

46. The system of claim 45 wherein said first clock signal is an external clock signal.

47. The system of claim 45 wherein said first portion of said first clock signal is a first edge of said first clock signal.

48. The system of claim 45 wherein said first portion of said first clock signal is a rising edge of said first clock signal.

49. The system of claim 39 wherein said at least one memory bank is a plurality of memory banks.

50. The system of claim 49 wherein a number of said memory banks is $2^n$, where n is greater than 0.

51. The system of claim 39, wherein a portion of said first address is used as an identifier for said planes of said plurality of memory banks.

52. The system of claim 39 wherein said addressing circuit comprises:

a first addressing portion providing a first portion of said first and second addresses to said interface circuit; and a second addressing portion providing a second portion of said first and second addresses to said interface circuit, wherein said first and second addressing portions are driven by a second clock signal responsive to said first portion of said first clock signal.

53. The system of claim 52 wherein said first clock signal is an external clock signal.

54. The system of claim 52 wherein said first portion of said first clock signal is a first edge of said first clock signal.

55. The system of claim 52 wherein said first portion of said first clock signal is a rising edge of said first clock signal.

56. The system of claim 52 wherein said second clock signal is an internal clock signal.

57. The system of claim 56 wherein said second clock signal is responsive to a first edge of said first clock signal.

58. The system of claim 56 wherein said second clock signal is responsive to a rising edge of said first clock signal.

59. The system of claim 52 wherein said first addressing portion comprises:

a multiplexer, said multiplexer having a plurality of inputs and an output;

a row address generating portion providing a row portion of said first and second address to a first input of said multiplexer;

a first column address generating portion providing a first column portion of said first address to a second input of said multiplexer; and a second column address generating portion providing a second column portion of said second address to a third input of said multiplexer, wherein said multiplexer output is controlled to be either said row or column portions of said first portion of said first and second addresses.

60. The system of claim 59 wherein said first column address generating portion comprises:

a counter receiving said portion of said first address and generating therefrom an additional address portion; and a second multiplexer having said portion of said first and additional address portion as inputs, said second multiplexer being controlled to output one of said inputs to said second multiplexer as said portion of said first address associated with said first portion of said first clock signal and to output said portion of said additional address at a subsequent first portion of said first clock signal.

61. The system of claim 60 wherein said first clock signal is an external clock signal.

62. The system of claim 60 wherein said first portion of said first clock signal is a first edge of said first clock signal.

63. The system of claim 60 wherein said first portion of said first clock signal is a rising edge of said first clock signal.

64. The system of claim 59 wherein said second column address generating portion comprises:

an incrementor receiving said portion of said first address and generating therefrom said portion of said second address;

a counter receiving said portion of said second address and generating therefrom an additional address portion of said second plane; and a second multiplexer having said portion of said second and additional address portion as inputs, said second multiplexer being controlled to output one of said inputs to said second multiplexer as said portion of said second address associated with said first portion of said first clock signal and to output said portion of said additional address at a subsequent first portion of said first clock signal.

65. The system of claim 64 wherein said first clock signal is an external clock signal.

66. The system of claim 64 wherein said first portion of said first clock signal is a first edge of said first clock signal.

67. The system of claim 64 wherein said first portion of said first clock signal is a rising edge of said first clock signal.

68. The system of claim 60 wherein said second column address generating portion comprises:

an incrementor receiving said portion of said first address and generating therefrom said portion of said second address;

a counter receiving said portion of said second address and generating therefrom an additional address portion of said second plane; and a third multiplexer having said portion of said second and additional address portion as inputs, said third multiplexer being controlled to output one of said inputs to said third multiplexer as said portion of said second address associated with said first portion of said first clock signal and to output said portion of said additional address at a subsequent first portion of said first clock signal.

69. The system of claim 52 wherein said second addressing portion comprises:

a multiplexer, said multiplexer having a plurality of inputs and an output;

a row address generating portion providing a row portion of said first and second address to a first input of said multiplexer; and a column address generating portion providing a column portion of said first and second address to a second input of said multiplexer, wherein said multiplexer output is controlled to provide either said row or column second portions of said first and second addresses.

70. The system of claim 39 wherein said circuit operates as a double data rate synchronous dynamic random access memory circuit.

71. The system of claim 39 wherein each of said memory bank comprises 16M of memory cells.

72. The system of claim 39 wherein memory cells corresponding to said first and second addresses are accessed simultaneously.

73. The system of claim 41 wherein memory cells corresponding to said first and second addresses are accessed simultaneously associated with said first portion of said first clock signal and memory cells corresponding to said additional address are accessed simultaneously associated with a subsequent first portion of said first clock signal.

74. The system of claim 45 wherein memory cells corresponding to said first and second addresses are accessed simultaneously associated with said first portion of said first clock signal and memory cells corresponding to said additional address are accessed simultaneously associated with subsequent first portions of said first clock signal.

75. The system circuit of claim 39 wherein each plane for each of said at least one memory bank is divided into a plurality of sections.

76. The system of claim 75 wherein each of said plurality of sections is divided into a plurality of subsections.

77. A method of addressing a double data rate synchronous dynamic random access memory (SDRAM) device, said SDRAM comprising at least one memory bank, each of said memory bank being divided into at least two planes, each of said planes having memory cells organized into rows and columns, said method comprising the steps of:

receiving a first address corresponding to a location within at least a first plane of one of said at least one memory bank associated with a first portion of a first clock signal;

generating a second address corresponding to a location within at least a second plane of a same memory bank associated with a first portion of said first clock signal; and applying said first and second addresses to circuitry of said SDRAM to allow access to said memory cells of said addressed planes.

78. The method of claim 77 further comprising the step of generating an additional address for said at least first and second planes associated with said first portion of said first clock signal.

79. The method of claim 77 wherein said first portion of said first clock signal is a first edge of said first clock signal.

80. The method of claim 77 wherein said first portion of said first clock signal is a rising edge of said first clock signal.

81. The method of claim 77 wherein said first clock signal is an external clock signal.

82. The method of claim 77 further comprising the step of generating a plurality of additional addresses for said at least first and second planes at subsequent first portions of said first clock signal.

83. The method of claim 82 wherein said first portion of said first clock signal is a first edge of said first clock signal.

84. The method of claim 82 wherein said first portion of said first clock signal is a rising edge of said first clock signal.

85. The method of claim 82 wherein said first clock signal is an external clock signal.

86. The method of claim 77, wherein a portion of said first address is used as an identifier for said planes of said plurality of memory banks.

87. The method of claim 77 further comprising the step of providing a second clock signal being responsive to said first portion of said first clock signal and wherein said generating step is performed at an active edge of said second clock signal.

88. The method of claim 87 wherein said second clock signal is an internal clock signal.

89. The method of claim 77 further comprising the steps of:

splitting said first address into first and second address portions;

generating a first portion of said second address from said first portion of said first address; and generating a second portion of said second address from said second portion of said first address.

90. The method of claim 89 further comprising the step of combining said first and second portions of said first and second addresses prior to accessing said planes of memory.

91. The method of claim 77 wherein locations corresponding to said at least first and second planes are accessed simultaneously.

* * * * *

UNITED STATES PATENT AND TRADEMARK OFFICE
CERTIFICATE OF CORRECTION

PATENT NO. : 6,044,032
DATED : March 28, 2000
INVENTOR(S) : Wen Li

It is certified that error appears in the above-identified patent and that said Letters Patent is hereby corrected as shown below:

COLUMN 10:

Claim 22, line 5, "halting" should read --having--.

Signed and Sealed this

Twenty-ninth Day of May, 2001

Attest:

NICHOLAS P. GODICI

*Attesting Officer*     *Acting Director of the United States Patent and Trademark Office*